(12) United States Patent
Simon

(10) Patent No.: US 6,502,968 B1
(45) Date of Patent: Jan. 7, 2003

(54) PRINTED CIRCUIT BOARD HAVING A LIGHT SOURCE

(75) Inventor: Ernst-Ulrich Simon, Oberursel (DE)

(73) Assignee: Mannesmann VDO AG, Frankfurt (DE)

(*) Notice: Subject to any disclaimer, the term of this patent is extended or adjusted under 35 U.S.C. 154(b) by 0 days.

(21) Appl. No.: 09/468,285

(22) Filed: Dec. 20, 1999

(30) Foreign Application Priority Data

Dec. 22, 1998 (DE) .......................................... 198 59 338
Oct. 27, 1999 (DE) .......................................... 199 51 865

(51) Int. Cl.$^7$ .............................................. F21V 21/00
(52) U.S. Cl. .................... 362/489; 362/84; 362/249; 362/800
(58) Field of Search ........................ 362/84, 488, 489, 362/543, 544, 545, 800

(56) References Cited

U.S. PATENT DOCUMENTS

| 4,345,308 A | * | 8/1982 | Mouyard et al. | 362/332 |
|---|---|---|---|---|
| 5,570,950 A | * | 11/1996 | Griffin | 362/221 |
| 5,577,832 A | * | 11/1996 | Lodhie | 362/249 |
| 5,669,703 A | * | 9/1997 | Wheeler et al. | 362/249 |
| 5,750,974 A | * | 5/1998 | Sasaki et al. | 235/454 |
| 5,806,965 A | * | 9/1998 | Deese | 362/249 |
| 5,882,105 A | * | 3/1999 | Barlow | 362/226 |
| 6,079,839 A | * | 6/2000 | Leibe | 362/31 |

FOREIGN PATENT DOCUMENTS

| DE | 2941634 | 4/1980 |
|---|---|---|
| DE | 3538187 | 4/1986 |
| DE | 8529956 | 8/1986 |
| DE | 8814490 | 2/1989 |
| DE | 8429939 | 3/1989 |
| DE | 4023693 | 3/1991 |
| DE | 4305793 | 9/1994 |
| DE | 19627858 | 1/1998 |

* cited by examiner

Primary Examiner—Thomas M. Sember
(74) Attorney, Agent, or Firm—Martin A. Farber (57) ABSTRACT

In a printed circuit board (1) for a display instrument, a support (3) is used for holding a light source (5). For this, the support (3) is fitted onto the printed circuit board (1), which has a conductor track (2), using a fixing means (7). This allows the light source (5) to be individually matched to different applications, and gives it a small physical height at the same time. In this arrangement, there is no need for the use of optical fibers, and this allows the reading accuracy of the instrument to be improved, particularly as a result of a uniform, high illumination level.

23 Claims, 6 Drawing Sheets

PRINTED CIRCUIT BOARD HAVING A LIGHT SOURCE

FIELD AND BACKGROUND OF THE INVENTION

The invention relates to an electronic printed circuit board which is designed for a display instrument, particularly in a motor vehicle, and has a light source.

Display instruments for modern vehicles have a printed circuit board holding the essential components. In addition to the necessary electronic components, this printed circuit board usually also accommodates a pointer drive system for an analog pointer-type instrument, a light source and possibly other mechanical and/or optical components. The thus populated printed circuit board can then be easily inserted into an appropriate housing of the display instrument and can then be fitted, together with this display instrument, into a dashboard in a motor vehicle. To illuminate a dial plate and for background or transmitted illumination of symbols, warning indicators or monitoring displays, the printed circuit board is fitted with at least one light source, which is often connected to an optical fiber. In particular, the light source is also used for actively illuminating a liquid crystal display (LCD).

A disadvantage of printed circuit boards of the aforementioned type is that any change in the position of the light source on the printed circuit board usually requires that the printed circuit board be completely reconstructed. This means that the use of the printed circuit board is generally restricted to a single application, and that changing the display instrument is associated with considerable complexity.

It is already known practice to connect the light source to an optical fiber so that the area which is to be illuminated can then be reached better. In this arrangement, a diffuser ensures that light emerges uniformly at the desired point, the optical fiber itself being of very shallow design and affecting the physical height only insignificantly. A disadvantage of this is that the light emerging from the diffuser, particularly for illuminating large areas, such as are found in actively illuminated liquid crystal displays, does not allow a sufficient illumination level. There are then frequently differences in brightness, which the observer perceives as irritating and which make reading more difficult. In addition, the difference in brightness gives an inferior impression which cannot be prevented even by using more powerful light sources.

SUMMARY OF THE INVENTION

The invention is based on the problem of providing a printed circuit board of the aforementioned type which is intended for a display instrument in such a way that it can be used flexibly for different display instruments and the illumination level is increased at the same time. In particular, it should also be possible to achieve particularly uniform illumination without differences in brightness.

The invention solves this problem in that the light source is arranged on a support which is designed as a bridge and is mounted on the printed circuit board by a fixing means. This allows the area under the support to be used for other electronic components, which means that the design can be compact. The support can be mounted at no distance from the populated printed circuit board, so that there is only an insignificant increase in the physical height, or none at all, as a result. At the same time, the support itself can be made of a comparatively thin material, since it does not need to have any conductor tracks. In addition, the arrangement of the light source on the support allows flexible positioning of the light source on the printed circuit board, without any change in the electronic components or rearrangement of the conductor tracks being necessary for this. To this end, the support can easily be positioned at a predetermined point using the fixing means, which allows the fixing, which can be both detachable and undetachable, to be immediately monitored visually and mechanically. This allows flexible adaptation to different applications, and, in particular, further supports can be added and easily replaced for servicing. In addition, the power loss from the light source in the form of heat has no disadvantageous effect on electronic components arranged on the printed circuit board, since the physical decoupling provides for improved heat dissipation. Electrical contact with the light source could be made by means of cables, for example; however, it is particularly beneficial if the support is designed as a rigid or flexible printed circuit board and holds conductor tracks for supplying the light source with electrical power. The extraordinary compactness means that the printed circuit board according to the invention can also advantageously be used, in particular, for combined display instruments having a plurality of displays, as used in motor vehicles, in particular.

A particularly advantageous embodiment of the invention is provided when the fixing means has a clip connection. This allows easy connection of the support to the printed circuit board without additional auxiliary means or tools. It also allows easy implementation of a practical modular design, so that an individual display instrument is produced by connecting individual components using the clip connection.

In this regard, a development of the invention which is particularly beneficial is one in which the fixing means is integrally connected to a housing of the display instrument. This allows the support to be connected directly to the housing, which means that there is no need for complicated positioning, and the number of components is reduced. In this case, the printed circuit board connected to the support is secured in the predetermined installation position subsequently, for example as an addition.

It is also beneficial if, according to one development of the invention, the fixing means is a hinge. This allows the printed circuit board and the support to be premounted, first, irrespective of the subsequent installation position, enabling the support to be pivoted into the final position after the printed circuit board has been fixed. This means that, in particular, configurations of the type in which the display plane and the plane of the printed circuit boards are not parallel to one another can also be produced.

Assembly is particularly simple if the fixing means has an electrical contact arrangement. In this case, electrical contact is made at the same time as the support is fixed, in only one operation. Furthermore, possible sources of error both in assembly and in operation can then be largely eliminated.

In this case, the support is fixed particularly simply in that the support is bonded to the printed circuit board. This allows the support to be arranged at virtually any desired point on the printed circuit board. This requires no special preparation or configuration of the printed circuit board. At the same time, an adhesive or a double-sided adhesive strip used for bonding also serves for insulation and protection of the printed circuit board against mechanical damage.

Electrical contact could be achieved by means of a solder connection. On the other hand, a particularly advantageous embodiment of the invention is provided in that the support can be placed in electrical contact with the printed circuit board by means of a plug connection. Such a plug connection requires only a small degree of complexity in the assembly process, and can easily also be retrofitted at a later instant, for example if further displays are desirable. At the same time, the plug connection also allows the use of a support which is not suitable for a solder connection on account of the thermal or mechanical loading, or which, to simplify the assembly process, cannot be connected to the printed circuit board until at a later instant.

By way of example, the support could be hardboard or rigid-plastic board. According to another development of the invention, however, it is particularly advantageous if the support is a ceramic substrate. This ensures good dissipation of the heat given off by the light source. Conductor tracks can be printed on the substrate for making electrical contact with the light source.

One embodiment is particularly advantageous if the support is a foil. This firstly produces a comparatively small thickness, which results in a very compact design for the display, and secondly the foil allows the light source to be adapted flexibly to different installation positions. In particular, this also allows curved surfaces at different levels in height to be produced.

In such a case, it is particularly beneficial if the support is elastically deformable. This means that, in the installation position, the support can be arranged such that it is pre-stressed against the printed circuit board, which makes simple, reliable fixing possible. At the same time, the support comes to bear optimally against the printed circuit board, so that a compact design can be achieved. This likewise allows for simpler connection of a support having the light source and the contact arrangement provided only on the front, because, first, the surfaces of the support and of the printed circuit board are placed onto one another and contact is made with them, and then the support is folded over, so that the light source subsequently points in the direction facing away from the printed circuit board. Furthermore, any components of the printed circuit board which might be arranged underneath the support can be accessed without any difficulty, even for servicing, by lifting off the support from the printed circuit board.

In this context, a development of the invention which is also particularly simple is one in which the support can be rolled. This means that it can be produced economically by the meter with a light source which is already fitted, for example, and that it need merely be cut to the desired length in the assembly process.

In this context, it is also particularly advantageous if the support has a reflector for the light source. This allows the desired area to be illuminated specifically and uniformly with little complexity. For example, the support can also be designed such that the light source inserted in the reflector does not protrude from said reflector, which means that the light source is arranged so as to be protected against damage.

The support can be made of any desired material. However, one embodiment of the invention is particularly beneficial if the support comprises a section of the printed circuit board. The section of the printed circuit board, together with the printed circuit board, can have components fitted in a single operation. When the section has been separated off, it forms the support. This allows the manufacturing process to be simplified and means that, by cleverly utilizing the geometry of the printed circuit board, an otherwise useless residual portion (waste) can be used as a support.

The light source can be a conventional incandescent lamp, for example. A particularly advantageous embodiment of the invention is one in which the light source is a light-emitting diode (LED). Such light-emitting diodes can be soldered directly to the support and can be arranged next to one another with only a small gap, so that the result is a uniform light source with little susceptibility to faults. In this arrangement, such light-emitting diodes afford the possibility of radiating light of different colors, depending on the driving.

It is also particularly beneficial if the support is an electroluminescent foil. This electroluminescent foil inherently combines the function of the support and of the light source, so that further components can be dispensed with and consequently a significantly smaller physical height can be achieved.

A preferential improvement in the heat dissipation from the light source can be achieved, and it can also advantageously become possible to arrange additional components on the printed circuit board in the area of the support, if, in accordance with another development of the invention, the support does not rest directly on the printed circuit board, but is at a distance from it.

Particularly if the light source has a high power loss, it is especially advantageous, according to another development of the invention, for a heat-dissipating element to be arranged between the printed circuit board and the support. The heat-dissipating element can be a passive cooling element, for example in the form of metal cooling ribs, or an active cooling element, for example in the form of a cooling line charged with coolant.

It is conceivable for the support to be arranged approximately parallel to the printed circuit board; however, in accordance with another advantageous development of the invention, in which the support is arranged at an acute angle to the printed circuit board, the light source can be oriented specifically onto the area which is to be illuminated, which increases the illumination level.

BRIEF DESCRIPTION OF THE DRAWINGS

The invention permits various embodiments. To illustrate its basic principle further, a plurality of these are described below and are shown in figures of the drawings in which.

DETAILED DESCRIPTION OF THE PREFERRED EMBODIMENT

Figure 1:
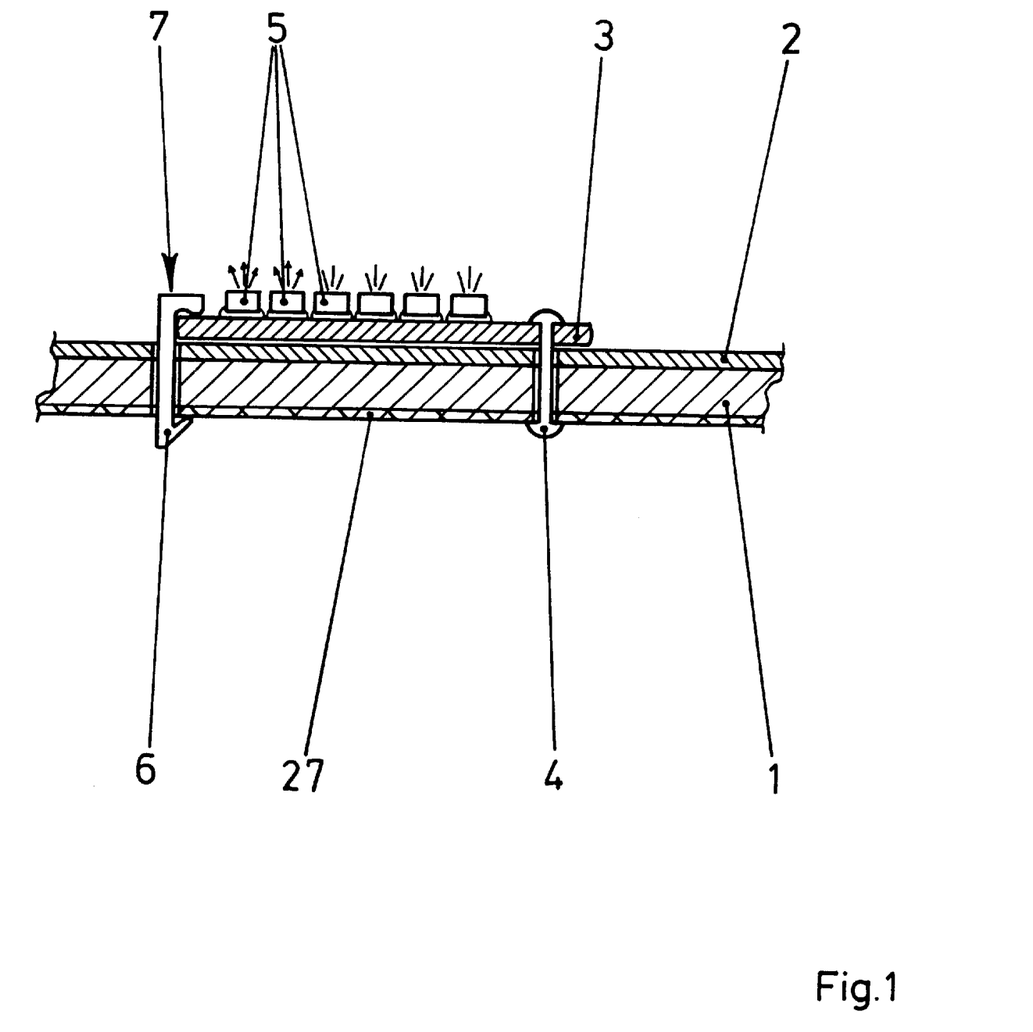
FIG. 1 shows a side sectional illustration of a printed circuit board according to the invention.

FIG. 1 shows a sectional side view of a printed circuit board 1 for a display instrument (not shown in more detail here), particularly a combined display instrument, in a motor vehicle, having a conductor track 2. Fitted onto the conductor track 2 is a support 3 which is electrically connected, by means of an electrical contact arrangement 4 in the form of a contact pin, to a conductor track 27 arranged on that side of the printed circuit board 1 which is remote from the support 3. The contact pin can also hold the support 3 mechanically on the printed circuit board 1. The support 3 accommodates light sources 5 in the form of LEDs and is mechanically connected to the printed circuit board 1 using a fixing means 7 equipped with a clip connection 6.

Figure 2:
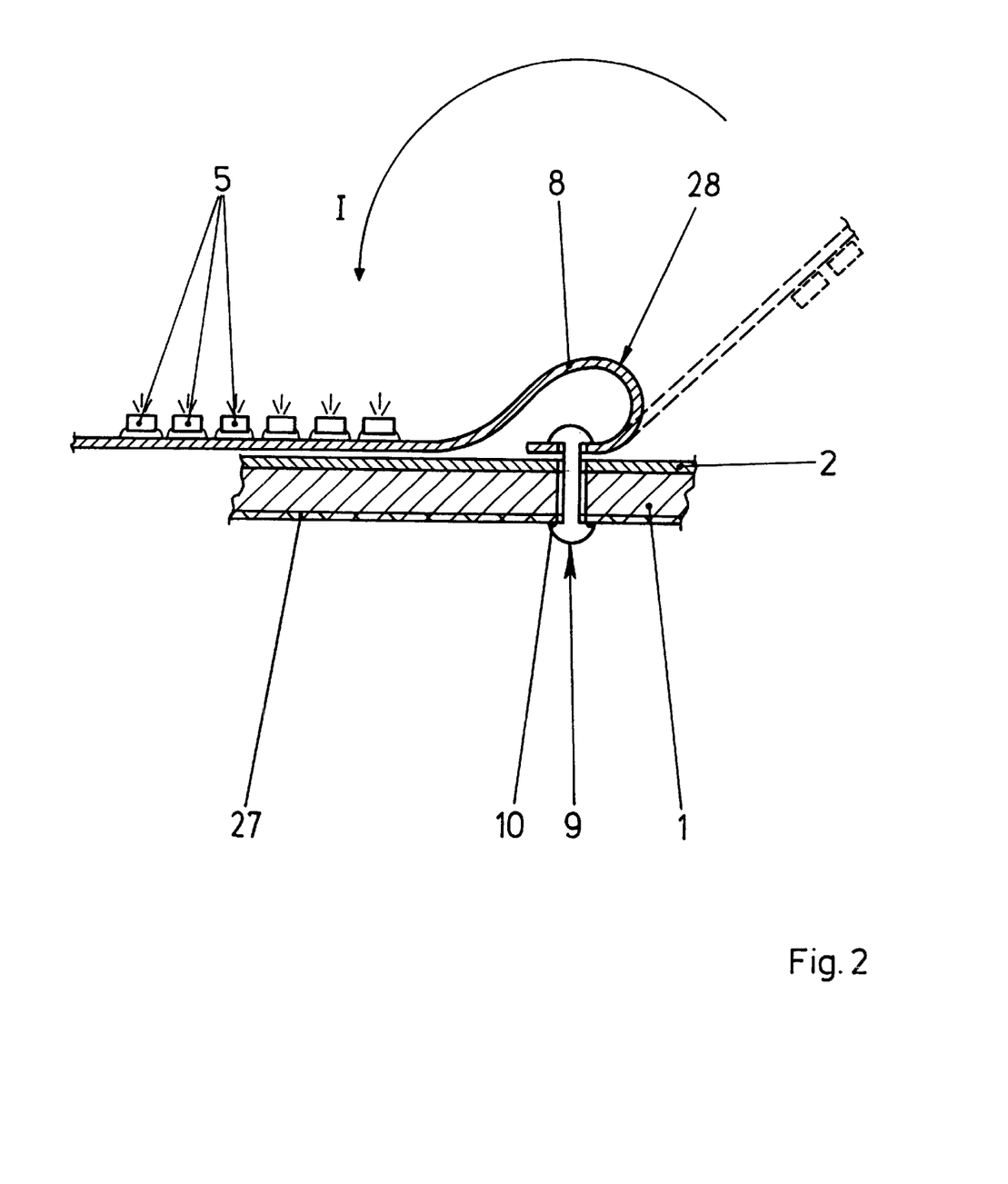
FIG. 2 shows a side sectional illustration of the printed circuit board having a flexible support.

FIG. 2 shows a sectional side view of the printed circuit board 1 having a flexible support 8 fitted onto the conductor track 2. In this arrangement, a fixing means 9 in the form of a pin connection is at the same time in electrical contact 10 with the conductor track 27 for supplying power to the light sources 5. For assembly, the support 8 having the light sources 5 in the form of light-emitting diodes is first fitted onto the conductor track 2 by its top side 28. After electrical contact has been made using the contact arrangement 10, the flexible support 8 is folded through approximately 180° (folding direction I), so that the light sources 5 then point upward. To fix the support in this position, further holding means (not shown), for example clamp connections or parts of a housing (not shown), can be used.

Figure 3:
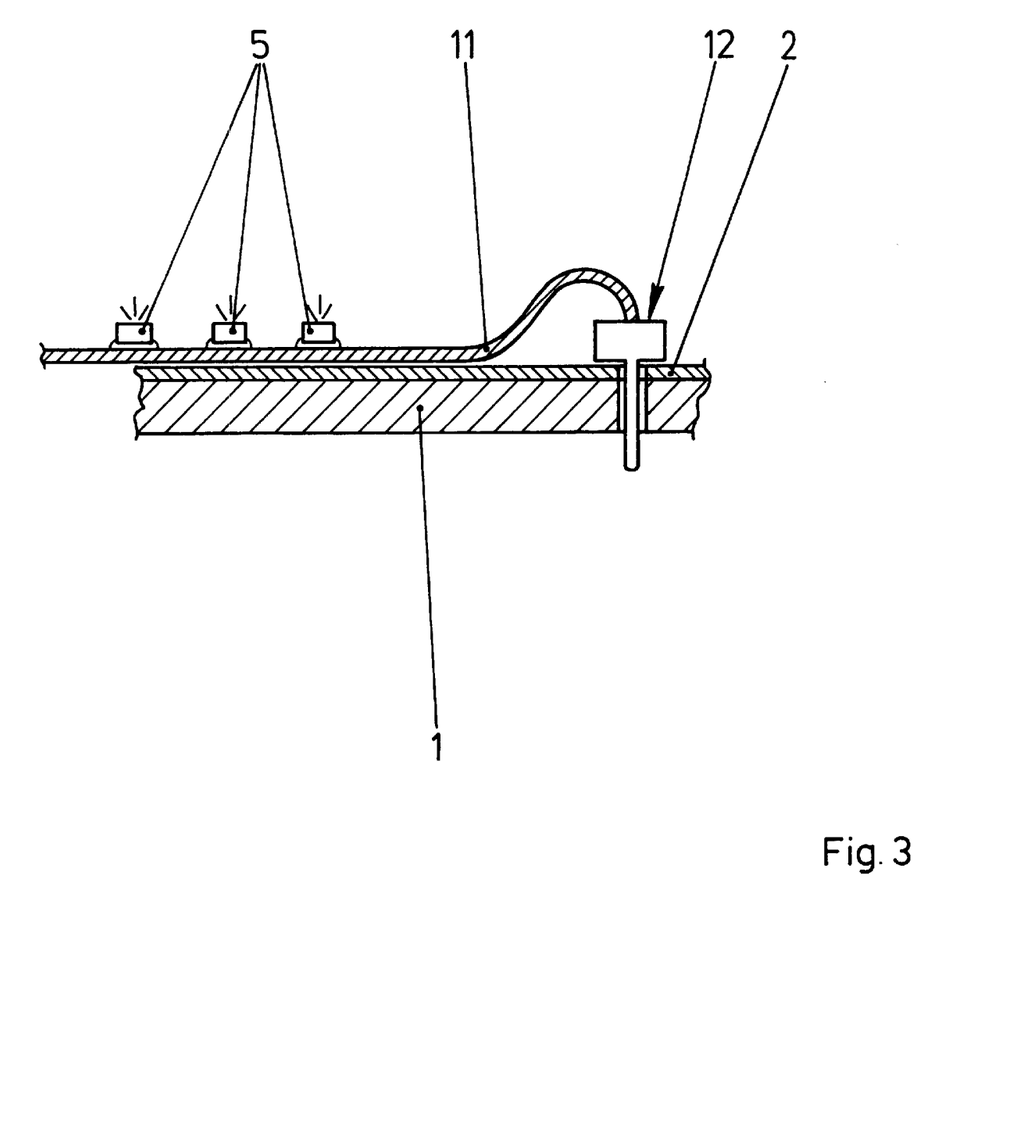
FIG. 3 shows a side sectional illustration of the printed circuit board having a support fixed by means of a plug connection.

FIG. 3 shows an embodiment of the printed circuit board 1 which has been modified only slightly in comparison with FIG. 2 and has a flexible support 11. In this arrangement, contact is made with the light source 5 arranged on the support 11 by means of an electrical plug connection 12. This plug connection 12 allows the support 11 to be mounted simply on the printed circuit board 1 and is consequently also suitable for retrofitting the printed circuit board 1 with the support 11 at a later time. For this, the support 11 can be in elastically deformable form, and can be prestressed against the printed circuit board 1, for example in the mounted position shown, so that it comes to bear directly against the printed circuit board 1 or the conductor track 2 as a result of the plug connection 12 being plugged in.

Figure 4:
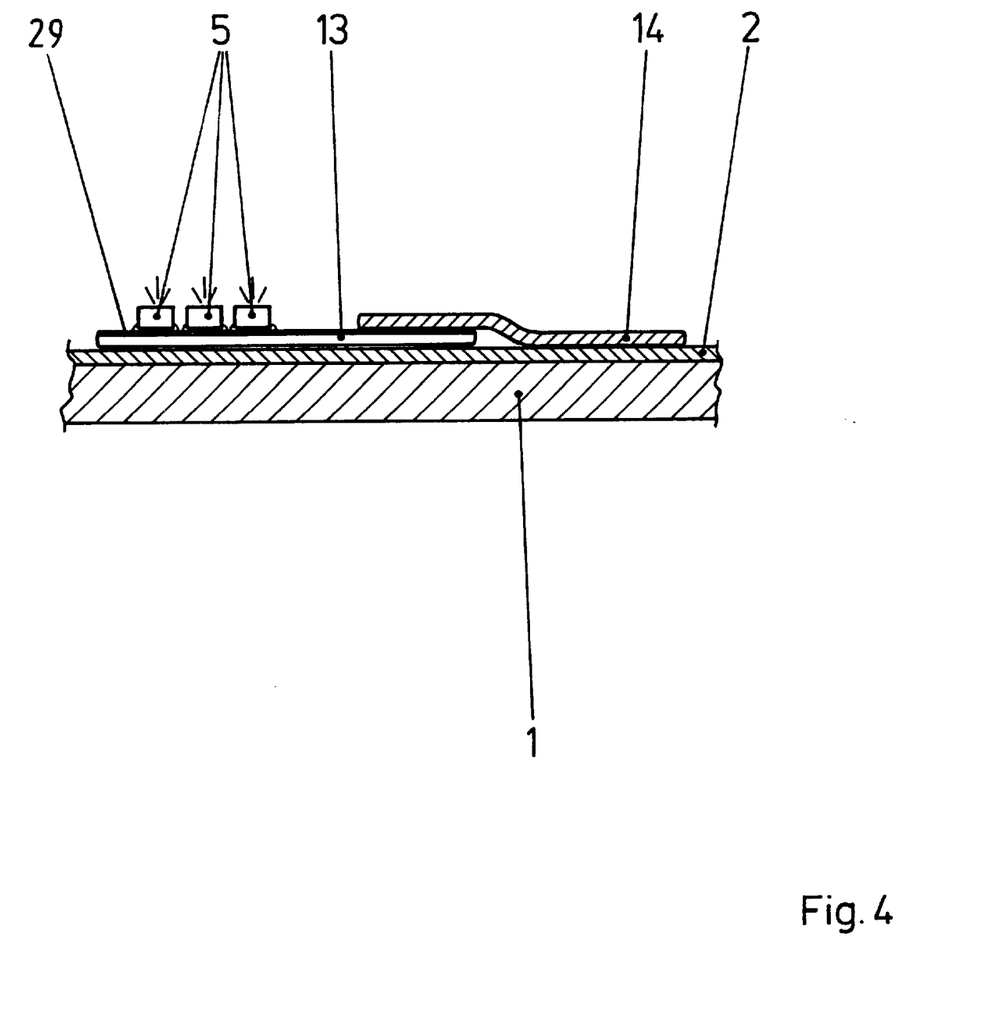
FIG. 4 shows a side sectional illustration of the printed circuit board having a support fixed by means of a solder link.

FIG. 4 shows a sectional side view of a simple embodiment of the printed circuit board 1, in which a support 13 is mounted on the conductor track 2 of the printed circuit board 1 using a fixing means 14. In this case, the fixing means 14 is a flexible printed circuit board foil which is connected, at one end, to the conductor track 2 of the printed circuit board 1 and, at the other end, to a conductor track 29 on the support 13 using a link-solder method to make electrical contact with the light sources 5. This results in a small physical height for the assembly comprising the printed circuit board 1 and the support 13. In this case, for illumination purposes, the light source 5 arranged on the support 13 can easily be placed against the back of an area which is to be illuminated, since all the other components of the printed circuit board 1 are behind the light source 5.

Figure 5:
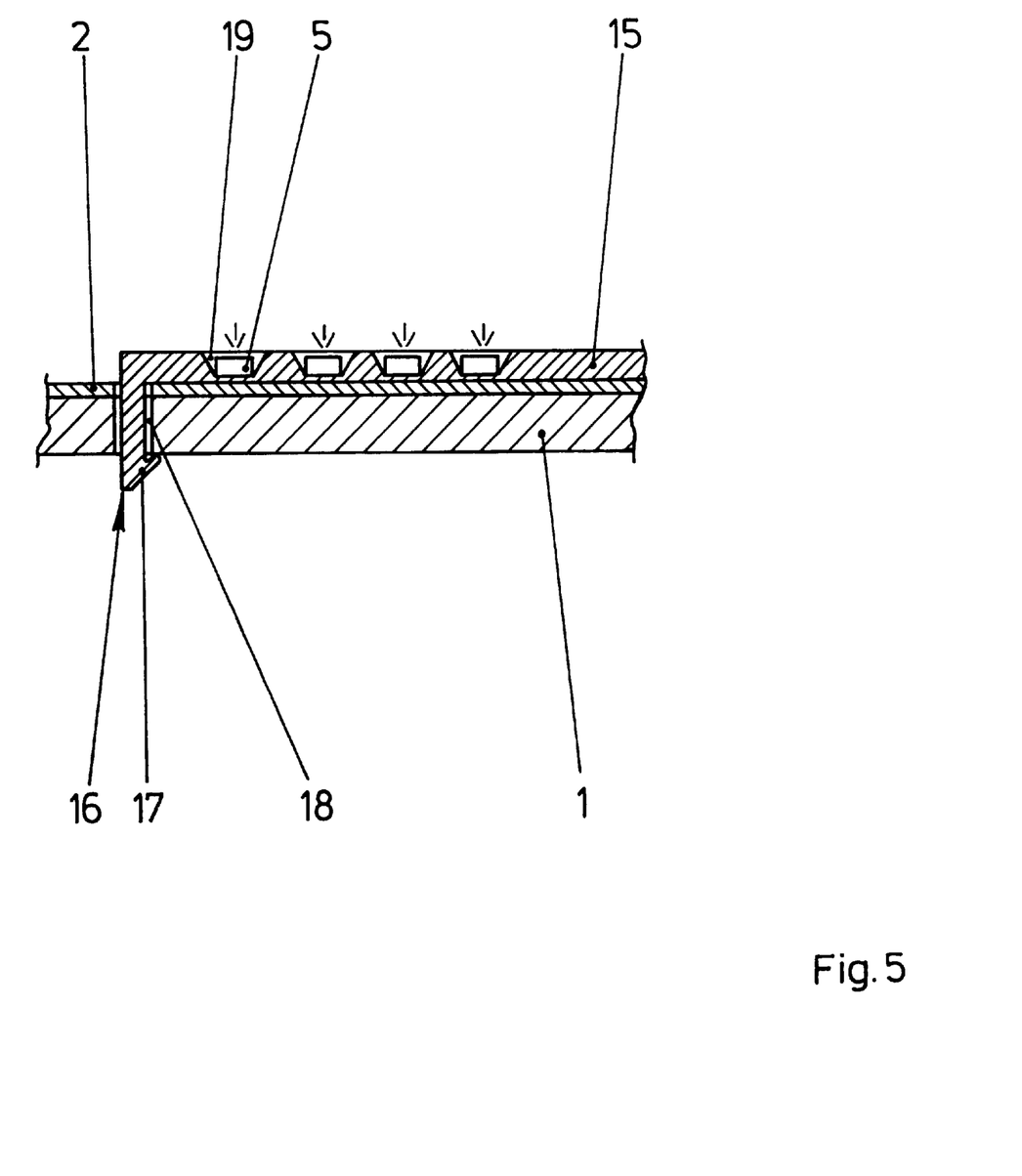
FIG. 5 shows a side sectional illustration of the printed circuit board having a support in the form of a reflector.

FIG. 5 shows a sectional side view of the printed circuit board 1 having the conductor track 2 and a support 15 fitted on top of the latter. The support 15 has a fixing means 16 with a clip connection 17 which passes through a cutout 18 in the printed circuit board 1 and latches at the back. The support 15 has a plurality of reflectors 19 which are in the form of a funnel-shaped depression and each hold a light source 5. This allows a significant improvement in the illumination of a desired object and, in particular, allows differences in brightness to be avoided on an area which is to be illuminated, with the light source 5 in the reflector 19 being arranged so as to be protected against mechanical damage at the same time. The means of electrical contact for the light sources 5 is not shown here, but is in a form in accordance with one of the embodiments shown in FIGS. 1 to 4, for example.

Figure 6:
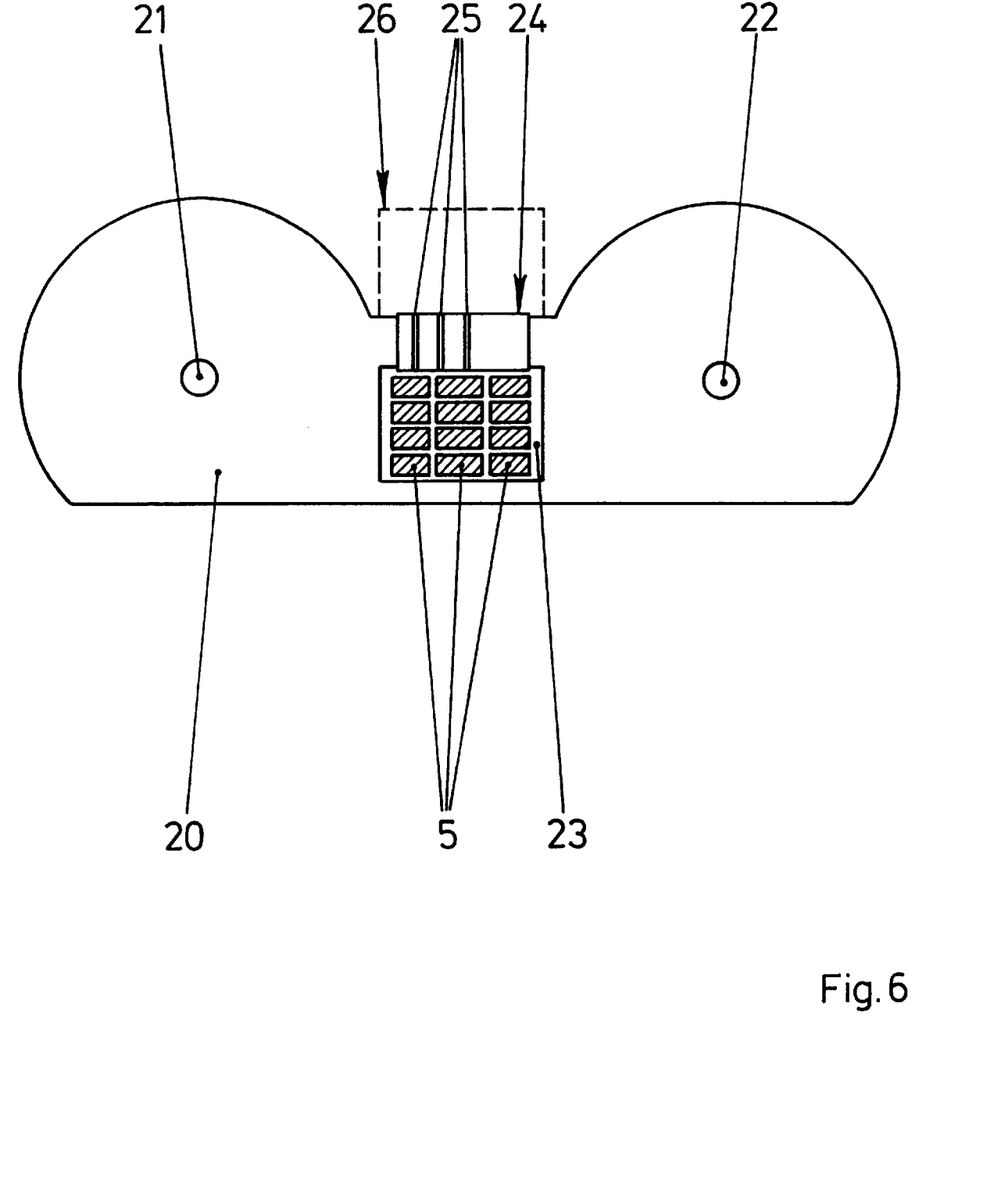
FIG. 6 shows a front view of a further printed circuit board.

FIG. 6 shows a front view of another embodiment of a printed circuit board 20. The printed circuit board 20 has approximately the contour of two round instruments with cutouts 21, 22 for a respective pointer flag (not shown). In this arrangement, a support 23 is first integrally connected to the printed circuit board 20 and, in a subsequent operation, is cut away along the dashed line. By folding over the support 23, the light sources 5 in the form of light-emitting diodes finish up on that side of the printed circuit board 20 which faces an observer. At the same time, a fixing means 24, in the form of a flexible foil, for the support 23 has an electrical contact arrangement 25 for connection to further structural elements (not shown) at the back of the printed circuit board 20. For this, the fixing means 24 can be assembled in a single operation together with the printed circuit board 20 and the support 23, for example, and, at the same time, a section 26 of the printed circuit board 20, which would otherwise need to be disposed of as a residual portion, can be put to good use as a support 23.

Depending on the illumination requirement, the support 23 having the light sources 5 does not necessarily have to be arranged in the center, as shown in FIG. 6, but can also be located below or above the first cutout 21 and/or below or above the second cutout 22, for example.

I claim:

1. A display instrument, for a motor vehicle, comprising
   a first electronic printed circuit board having conductor tracks, and
   a support, wherein a light source is arranged on the support, said support being formed as a second printed circuit board with conductor tracks connected to the light source,
   said support being mounted as a bridge to the first electronic printed circuit board by a fixing element, and
   electrical contacts connecting the conductor tracks of the second printed circuit board to the conductor tracks of the first printed circuit board for applying the light source with electric power,
   wherein a configuration and an orientation of the second printed circuit board are independent of the first printed circuit board by the bridge mounting and the fixing element to position the light source at a desired location relative to the first printed circuit board.

2. The display instrument as claimed in claim 1, wherein said fixing element (7, 16) has a clip connection (6, 17).

3. The display instrument as claimed in claim 1, wherein the fixing element (7, 9, 14, 16, 24) is integrally connected to a housing of the display instrument.

4. The display instrument as claimed in claim 1, wherein said fixing element (24) is a hinge.

5. The display instrument as claimed in claim 1, wherein the fixing element (9, 14, 24) has an electrical contact arrangement (10, 25).

6. The display instrument as claimed in claim 1, wherein the support (23) is bonded to the first printed circuit board (20).

7. The display instrument as claimed in claim 1, wherein the support (11) is in electrical contact with the first printed circuit board (1) by a plug connection (12) as said electrical contacts.

8. The display instrument as claimed in claim 1, wherein the support (3, 13, 15, 23) is a ceramic substrate.

9. The display instrument as claimed in claim 1, wherein the support (8, 11) is a foil.

10. The display instrument as claimed in claim 1, wherein the support (8, 11) is elastically deformable.

11. The display instrument as claimed in claim 10, wherein the support (8, 11) is rollable.

12. The display instrument as claimed in claim 1, wherein the support (15) has a reflector (19) for the light source (5).

13. The display instrument as claimed in claim 1, wherein the support (23) comprises a section (26) of, but separated from, the first printed circuit board (20).

14. The display instrument as claimed in claim 1, wherein the light source (5) is a light-emitting diode (LED).

15. The display instrument as claimed in claim 1, wherein the support is an electroluminescent foil.

16. The display instrument as claimed in claim 1, wherein the support (3, 8, 11, 13, 15, 23) is at a distance from the first printed circuit board (1, 20).

17. The display instrument as claimed in claim 16, wherein a heat-dissipating element is arranged between the first printed circuit board (1, 20) and said support (3, 8, 11, 13, 15, 23).

18. The display instrument as claimed in claim 1, wherein the support (3, 8, 11, 13, 15, 23) is arranged at an acute angle to the first printed circuit board (1, 20).

19. The display instrument as claimed in claim 1, wherein the second printed circuit board is rigid.

20. The display instrument as claimed in claim 1, wherein the second printed circuit board is flexible.

21. The display instrument as claimed in claim 1, wherein the electrical contacts also hold the support on the first printed circuit board.

22. The display instrument as claimed in claim 1, wherein the fixing element for the support is a flexible printed circuit foil connected to the conductor tracks on said support and said first printed circuit board.

23. The display instrument as claimed in claim 22, wherein said fixing element has an electrical contact arrangement (25) for connection to structural elements at a back of said first printed circuit board.

* * * * *